(12) United States Patent
Shafiyan-Rad et al.

(10) Patent No.: US 6,617,845 B1
(45) Date of Patent: Sep. 9, 2003

(54) PROXIMITY SENSOR RESISTANT TO ENVIRONMENTAL EFFECTS

(75) Inventors: Saeed Shafiyan-Rad, Nashua, NH (US); Isak Kayserman, Needham, MA (US); Larry Joseph Fischer, Nashua, NH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/561,025

(22) Filed: Apr. 28, 2000

(51) Int. Cl.[7] .................. G01B 7/14; B23K 37/00; B25J 19/02
(52) U.S. Cl. .............. 324/207.16; 324/207.26; 219/124.4; 901/46
(58) Field of Search ............ 324/207.26, 207.2–207.22, 324/236; 219/50, 124.1, 124.34, 124.4, 130.01; 228/218; 174/52.1–52.3; 307/116, 117; 901/35, 42, 46

(56) References Cited

U.S. PATENT DOCUMENTS

| 3,134,870 | A | * | 5/1964 | Reed et al. | |
| 4,123,707 | A | * | 10/1978 | Fujii et al. | 324/207.16 |
| 4,316,145 | A | * | 2/1982 | Tann | 324/208 |
| 4,571,479 | A | * | 2/1986 | Maeda et al. | 219/124.34 |
| 4,875,009 | A | * | 10/1989 | Leveque | 324/207.16 X |
| 4,996,408 | A | * | 2/1991 | Turck et al. | 219/130.01 |
| 5,542,378 | A | | 8/1996 | Kubiak et al. | 122/235.12 |
| 5,659,290 | A | * | 8/1997 | Haeri | 340/441 |
| 5,844,501 | A | * | 12/1998 | El-Ibiary | |
| 5,912,556 | A | * | 6/1999 | Frazee et al. | 324/207.2 |
| 5,952,822 | A | * | 9/1999 | Kayserman et al. | 324/207.26 X |
| 6,025,562 | A | * | 2/2000 | Shimizu et al. | 174/175 F |
| 6,060,678 | A | | 5/2000 | Allford | 219/60 R |
| 6,062,796 | A | * | 5/2000 | Alexander | |
| 6,156,995 | A | * | 12/2000 | Severance, Jr. | |

OTHER PUBLICATIONS

Halliday, David and Robert Resnick; Physics, Parts l and ll, Third Edition; p. 481, Table 22–2; New York: John Wiley & Sons (1978).*

* cited by examiner

Primary Examiner—Gerard R. Strecker
(74) Attorney, Agent, or Firm—Amin & Turocy; Alexander M. Gerasimow; William R. Walbrun

(57) ABSTRACT

A housing for a proximity sensor is resistant to harsh environmental effects, such as scorching particles due to sputtering in a welding environment. The sensor housing is formed of a material having a high thermal conductivity, such as copper or an alloy thereof. As a result, the housing is able to rapidly dissipate heat and, in turn, mitigate weld slag build-up so as to improve the efficacy of the sensor.

11 Claims, 4 Drawing Sheets

PROXIMITY SENSOR RESISTANT TO ENVIRONMENTAL EFFECTS

TECHNICAL FIELD

The present invention generally relates to proximity sensing and, more particularly, to a housing for a proximity sensor which is resistant to environmental effects, such as slag build-up that may occur in a welding environment.

BACKGROUND

Various types of proximity sensors are used for detecting the presence or absence of an object. Common types of non-contact proximity sensors include inductive proximity sensors, capacitive proximity sensors, ultrasonic proximity sensors, and photoelectric sensors. Such sensors, for example, may be used in motion or position applications, conveyor system control applications, process control applications, robotic welding applications, machine control applications, liquid level detection applications, selecting and, counting applications, as well as other known applications.

In an inductive proximity sensor, for example, an oscillator provides an oscillating signal to an inductive coil, which provides an electromagnetic field at a predetermined frequency. As an electrically conductive object moves within the field, eddy currents develop within the object in response to the oscillating electromagnetic field. The eddy currents alter the amplitude of the oscillating signal being provided to the coil. The amplitude of the oscillator signal typically is evaluated to provide an output signal indicative of the presence or absence of the object within the electromagnetic field.

Proximity sensors often are employed in manufacturing industries in which the sensors are exposed to harsh environmental conditions. By way of example, proximity sensors are utilized in conjunction with robotic welding to sense the position of work pieces and/or robot components during welding processes. The welding environment subjects the sensor to abrasion, chemical exposure, intense heat, and scorching particles that cause slag build-up. The environmental effects cause the sensor to deteriorate rapidly and eventually fail.

In order to help protect proximity sensors from such adverse effects, manufacturers utilize a Teflon coating or covering around the sensor. A typical Teflon coating is on the order of a few microns thick. While the Teflon helps mitigate damage to the sensor, the environmental conditions wear through the Teflon over an extended period of time, thereby exposing the sensor to the adverse environment. For example, there is substantial sputtering of molten welding materials which tend to contact the sensor housing and cause slag build-up. As a result of slag build up and other damage to the housing, false triggering (due to a change in sensing capability) and, in turn, premature sensor failure may occur. Once a sensor is unable to operate within acceptable parameters its replacement is imminent.

There are inherent difficulties associated with replacing a proximity sensor in a harsh environment. Replacement of a proximity sensor presents a significant safety concern to the technician performing the repair, as it may subject the individual to undesirable risk of exposure to the precarious environment. In order to reduce the risk, it may be necessary to temporarily interrupt or stop the manufacturing process, which results in undesirable and usually expensive down time in the manufacturing process.

SUMMARY

The present invention relates to a housing for a proximity sensor that is resistant to harsh environmental effects. The sensor housing is formed of a material having a high thermal conductivity. The housing is able to rapidly dissipate heat, such as due to contact with scorching materials sputtered during welding. Because the housing effectively dissipates heat, it mitigates slag build-up which, in turn, improves the efficacy of the sensor. As result, a sensor having a housing in accordance with the present invention may experience increased longevity in challenging industrial environments.

An aspect of the present invention provides a proximity sensor. The proximity sensor includes a housing which contains circuitry for sensing proximity of an object, wherein the housing is formed of a copper material.

Another aspect of the present invention provides a proximity sensor. The proximity sensor includes a sensor housing which contains sensing circuitry for sensing proximity of an object and providing a signal indicative thereof. The sensor housing is formed of a material having a thermal conductivity of at least greater than about 3 Watts per centimeter per Kelvin.

Still another aspect of the present invention provides a housing for a proximity sensor. The housing includes an elongated cylindrical sidewall portion for receiving sensing circuitry therein. The sidewall portion is formed of a copper material having a high thermal conductivity, whereby when the housing is employed in a welding environment slag build-up is mitigated.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

DESCRIPTION OF THE INVENTION

The present invention relates to a housing for a proximity sensor that is resistant to harsh environmental effects. The sensor housing is formed of a material having a high thermal conductivity. As a result, the housing is able to rapidly dissipate heat, such as due to contact with byproducts sputtered during welding. Because the housing effectively dissipates heat, it mitigates slag build-up.

Figure 1:
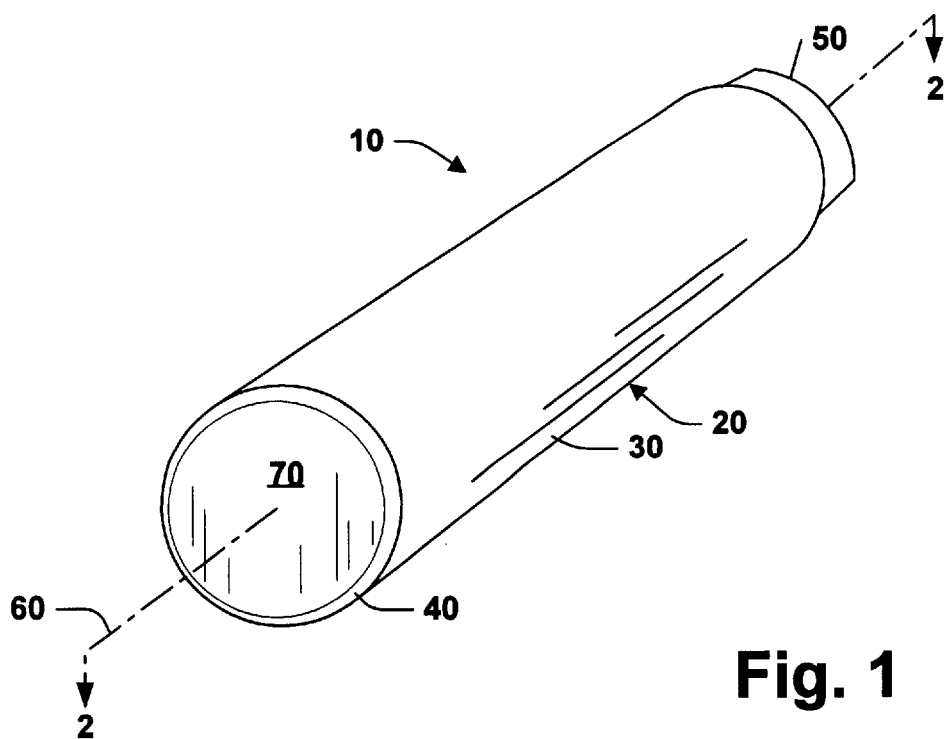
FIG. 1 is a perspective view of a proximity sensor in accordance with the present invention.

FIG. 1 is a perspective view of a proximity sensor 10 having a housing 20 in accordance with an aspect of the present invention. The housing 20 in this example has a smooth, generally circular cylindrical sidewall portion 30 with spaced apart end portions 40 and 50. A central axis 60 extends longitudinally through the end portions 40 and 50. One end portion 40 defines a sensing end. An appropriate sensing element and associated circuitry (FIG. 2) are located within the housing 20 adjacent the end 40. An end cap or sensing face 70 is attached at the end 40 for protecting the internal circuitry (FIG. 2) from the environment as well as for permitting the circuitry to perform a proximity sensing function through the cap as is known in the art. The end cap 70 may be formed of Teflon, a thermosetting plastic or resin material, or other material known in the art. The other end 50 has an associated connector for providing power to the internal circuitry and/or for providing one or more output signals indicative of the condition sensed by the circuitry.

In accordance with the present invention, the housing 20 is formed of a material having a high thermal conductivity, such as greater than about 3 Watts per centimeter per Kelvin (W cm$^{-1}$K$^{-1}$). For example, the housing 20 is formed of copper, a copper alloy, silver, a silver alloy, another material (or alloy) having a high thermal conductivity, or a combination of such materials. Copper and its alloys have advantages over other materials because they have high thermal conductivity and are relatively inexpensive. The higher its thermal conductivity, the better the housing is able to dissipate heat. Improved heat dissipation further mitigates build-up of weld slag, which usually results from contact between the housing and sputtering molten byproducts (e.g., during welding).

Table 1 provides a list of exemplary materials and their corresponding thermal conductivity, which may be used to form a housing in accordance with the present invention. It is to be appreciated that the materials identified in Table 1 are for purposes of illustration and that any material having a sufficiently high thermal conductivity (e.g., k>~3) may be used. Examples of other materials that may be utilized to form the housing 20 include silicon nitride, silicon oxynitride, etc. Those skilled in the art will appreciate that many alternative materials exist which may be employed to form the housing, all such materials are considered to be within the scope of the present invention.

TABLE 1

| MATERIAL | THERMAL CONDUCTIVITY (W cm$^{-1}$ K$^{-1}$) |
| --- | --- |
| copper | 4.03 |
| sulfur copper alloy | 3.74 |
| silver copper alloy | 3.46 |
| chromium copper alloy | 3.23 |
| Silver | 4.19 |

Figure 2:
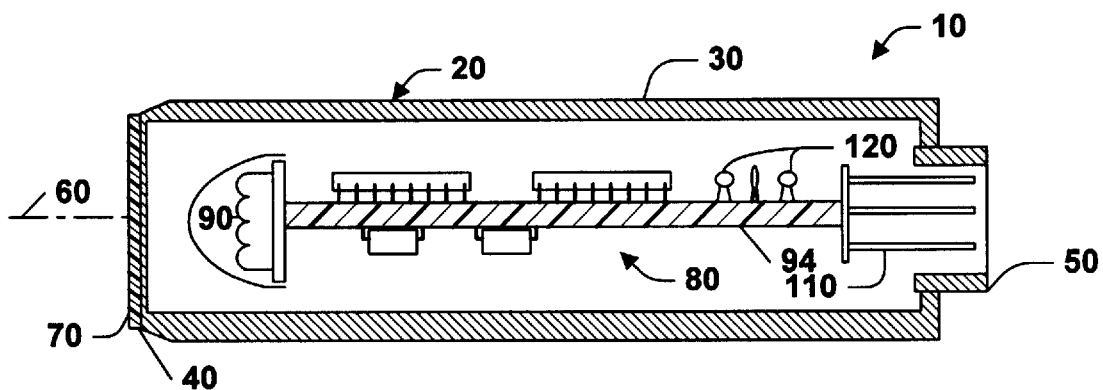
FIG. 2 is cross-sectional view of a proximity sensor, in accordance with the present invention, taken along line 2—2 of FIG. 1.

FIG. 2 is an example of a cross-sectional view of the sensor of FIG. 1, illustrating internal sensing circuitry 80. In this example, the sensing circuitry 80 is an inductive type of proximity sensor. The circuitry 80 includes an inductor coil 90 located adjacent the sensing end 40. The inductor coil 90 and associated circuitry are mounted to a circuit board 94.

By way of example, an oscillator provides an oscillating signal to the inductive coil 90, which provides an electromagnetic field at a predetermined frequency. The electromagnetic field extends from the coil 90 through the end cap 70. As an electrically conductive object moves within the field, eddy currents develop within the object in response to the oscillating electromagnetic field. The eddy currents alter the amplitude of the oscillator signal provided to the coil 90. The circuitry 80 also includes a detector circuit that analyzes the signal and provides an output signal indicative of the proximity (or lack thereof) of the object. The amplitude of the oscillator signal, for example, is evaluated to provide an output signal indicative of the presence or absence of the object within the sensing range of the sensor 10. The output signal may be provided to a connector 110, which passes the signal to external monitoring equipment and/or an appropriate indicator, such as a light emitting diode (LED) or a display.

Additionally or alternatively, one or more LEDs 120 may be part of the internal circuitry 80. Such LEDs, for example, may provide an indication as to whether the circuitry is powered ON and/or whether an object has been detected as being within a predetermined distance of the sensor 10. When one or more LEDs 120 are provided as part of the internal circuitry 80, apertures and appropriate lens covers (not shown) may be provided so that illumination from the LED indicators is visible.

It is to be understood and appreciated that the exemplary circuitry 80 shown and described with respect to FIG. 2 is for purposes of illustration and that any circuit configuration may be utilized without departing from the scope of the present invention. In particular, while the example of FIG. 2 illustrates an inductive proximity sensor 10, the present invention also contemplates other types of sensors, including capacitive proximity sensors, ultrasonic proximity sensors, photoelectric sensors, etc. Moreover, various types of male and female connectors and cables may be employed to connect the internal circuitry 80 to appropriate associated equipment. Shielding (not shown) also may be employed to further protect the internal circuitry 80 from external electromagnetic energy, such as to enhance weld field immunity.

Figure 3:
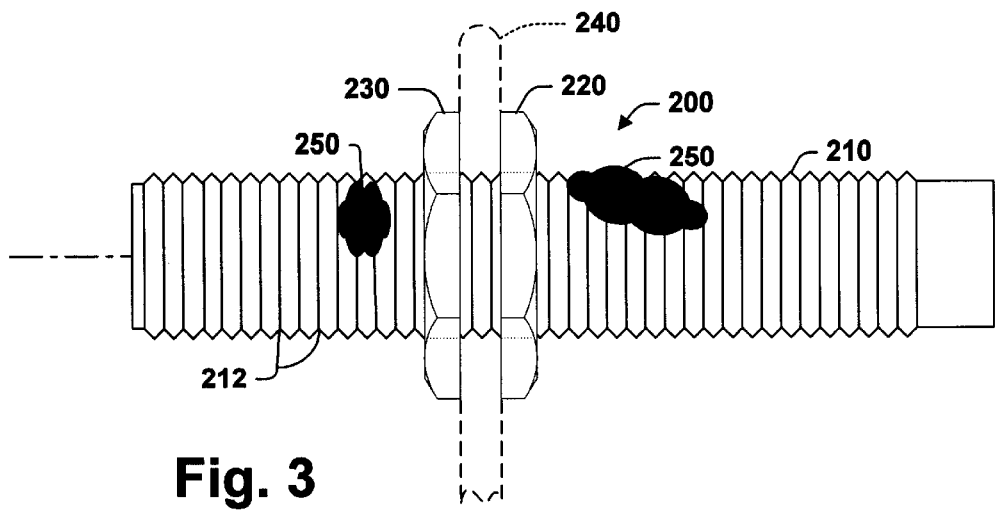
FIG. 3 is a side elevation of a conventional threaded proximity sensor illustrating slag build-up on the sensor housing.

FIG. 3 diagrammatically illustrates a conventional proximity sensor 200 that includes an elongated, circular cylindrical housing 210 formed of, for example, brass or stainless steel. In this example the housing 210 has external threads 212. In order to mount the threaded sensor 200 at an appropriate position, it is common to utilize a pair of threaded nuts 220 and 230 to secure the sensor to a bracket 240. When the conventional sensor 200 is employed in a harsh environment, such as metal fabrication and/or welding, sputtering of extremely hot (molten) materials occurs. The sputtering materials strike the housing 210 and, in turn, may burn through or into the sensor housing, form undesirable pits in the housing, and/or cause a build-up of slag 250 on the housing. Even when a Teflon coating (typically a few microns thick) is provided over the housing 210, the repeated exposure to the harsh environment eventually wears down or pits portions of the coating and embeds onto the surface of the sensor housing. Consequently, slag 250 still collects on a coated sensor housing 210, which adversely affects the sensing operation of the sensor 200.

The sensing capability (sensing distance) of the sensor 200 decreases in relation to the amount of slag build-up, usually resulting in premature sensor failure. The slag 250 further complicates removal of the sensor 200 from its mounted position, as the slag embeds within the threads 212 and inhibits threading of the nuts 220 and 230 off the threaded housing 210. Thus, it is often necessary to physically cut a failing proximity sensor 200 from its mounting arrangement so that it may be replaced. Because of the harsh environment in which the sensor 200 is employed, removal and replacement of the sensor poses a serious safety concern for the technician performing the repair if the process is not shut down prior to replacing the sensor. Stopping part of the assembly line causes a domino effect, which usually adversely affects other part of the line and aspects of the manufacturing process. In addition, reinitiating the manufacturing process often is a complex and time-consuming procedure. As a result, a relatively simple task of removing and replacing a sensor, may become an undesirable and expensive undertaking.

Figure 4:
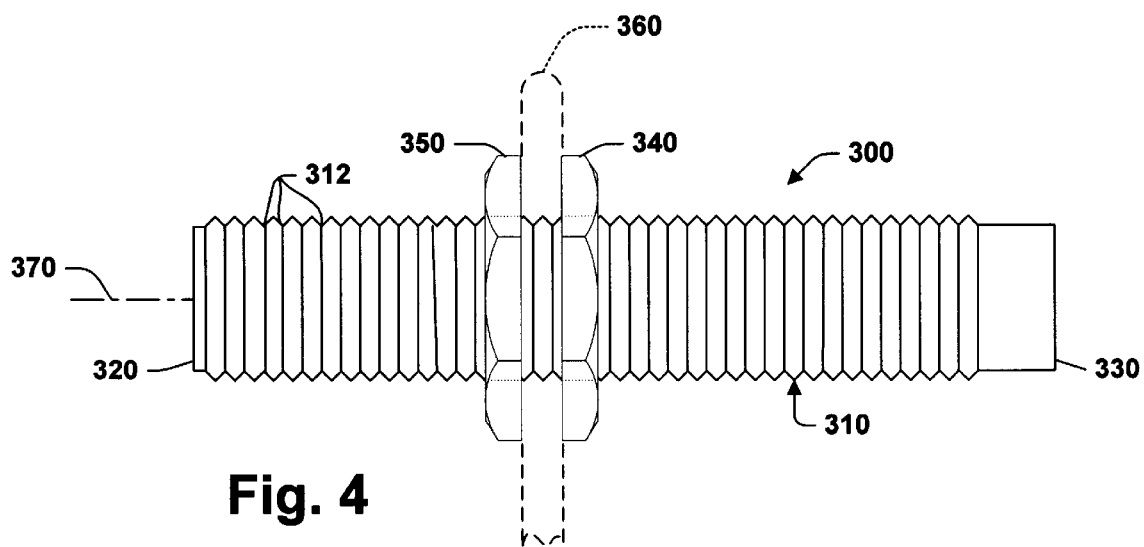
FIG. 4 is a side sectional view of a threaded proximity sensor in accordance with the present invention.

FIG. 4 depicts a sensor 300 having an elongated cylindrical housing 310 in accordance with an aspect of the present invention. In particular, the housing 310 is formed of a material having a high thermal conductivity (e.g. k>~3), such as described with respect to FIG. 1. The housing 310 includes external threads 312 formed in the exterior of the housing sidewall. The sensor includes a sensing end 320 and a connector end 330 which are spaced apart from each other. A pair of nuts 340 and 350 are illustrated as being threaded onto the housing 310 to mount the sensor 300 relative to a bracket 360. A central axis 370 extends through the ends 320 and 330, with the housing 310 and the nuts 340 and 350 being generally coaxial with the axis.

Advantageously, the high thermal conductivity of the housing 310 enables the housing to effectively dissipate heat, and mitigate slag welding to the housing such as occurs in response to extremely hot particles striking the housing. As a result, slag build-up up is mitigated, thereby improving the efficacy of the sensor 300. If and/or when the sensor fails, its replacement also is facilitated, as the nuts may be threaded along the housing in a conventional manner to effect removal of the sensor (cutting is not required).

Figure 5:
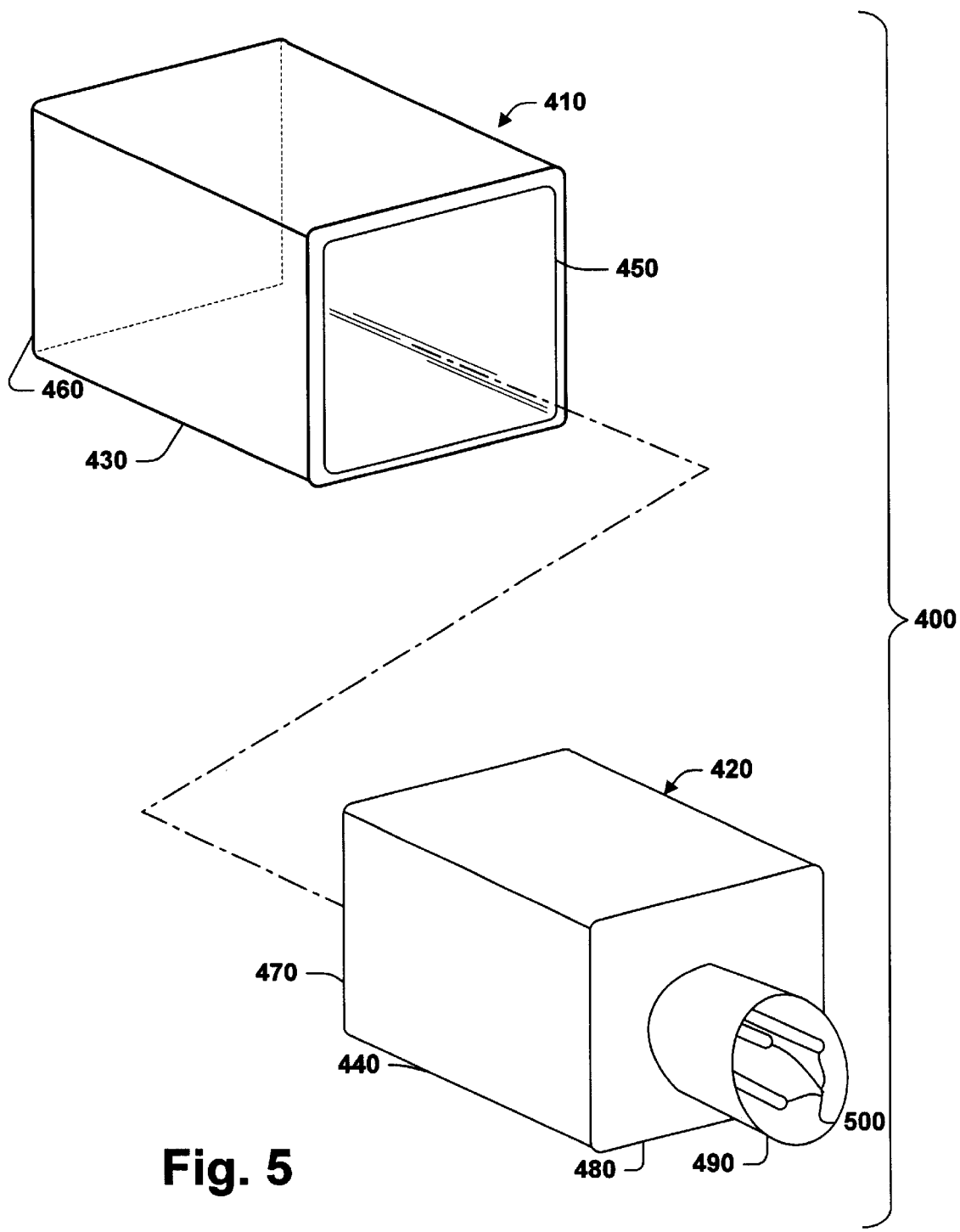
FIG. 5 is a partially exploded isometric view of a proximity sensor in accordance with the present invention.
Figure 6:
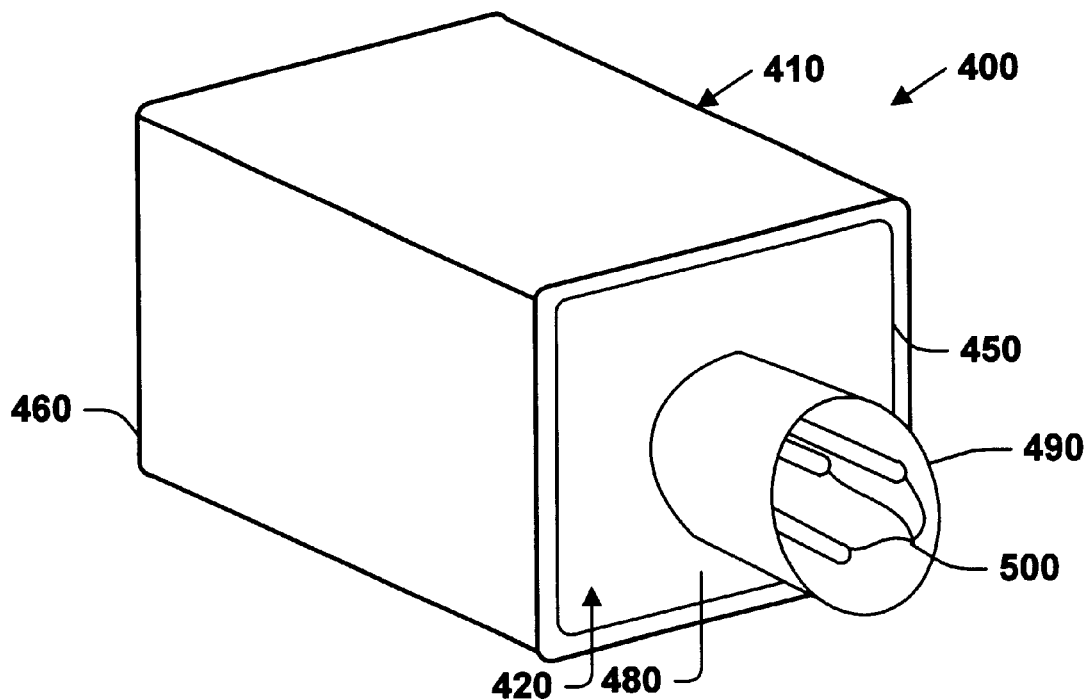
FIG. 6 is an isometric view of an assembled proximity sensor in accordance with the present invention.

FIGS. 5 and 6 illustrate another proximity sensor 400 having an external housing 410 in accordance with an aspect of the present invention. The housing 410 is in the form of an elongated, generally cylindrical sleeve or cover into which a corresponding sensor body 420 may be coaxially inserted. The housing 410 is formed of a suitable material having a high thermal conductivity, such as described with respect to FIG. 1.

The housing 410 is dimensioned and configured according to the dimensions and configuration of the sensor body 420 which the housing is to cover. Accordingly, in this example, both the housing 410 and the sensor body 420 have generally rectangular cylindrical sidewall portions 430 and 440, respectively. The internal dimensions of the housing 410 approximate the external dimension of the sensor body 420, such as to provide a relatively snug fit, as shown in FIG. 6. The housing 410 has an opening 450 at one end into which the body 420 may be inserted. The other end 460 of the housing 410 may be open or alternatively may be closed with a sheet of an appropriate material (e.g. Teflon, thermosetting resin, etc.) to help protect the sensor 400 from harsh environmental conditions while also permitting sensing through the end 460. A narrow elongated groove (not shown) also may be provided in the sidewall 430 (extending from the opening 450 toward the other end 460) to permit a small amount of flexing of the sidewall 430 and, in turn, facilitate mounting the sensor body 420 therein.

The sensor body 420 contains electronic circuitry for performing a desired sensing function, as is known in the art. The sensor body 420 has a sensing end 470 and a connector end 480 spaced apart from the sensing end. A connector 490 (e.g., a modular connector) extends from the end 480 which is configured for receiving and/or connecting to a desired cable. The cable, for example, is fire retardant so as to withstand the harsh environment. The exemplary connector 490 is shown as a male connector having three pins 500, although other connector types (male or female) may be employed in accordance with the present invention.

When the sensor 400 is employed in a harsh environment, welding slag build-up on the housing 410 is mitigated. Specifically, the high thermal conductivity of the housing 410 rapidly dissipates heat generated from contact with scorching particles sputtering during the welding process. As a result, weld slag does not heavily pit, weld itself to the housing and material, burn through, or build up slag on the sensor housing. Therefore, a sensor employing a housing in accordance with the present invention may be utilized for an extended period of time in a harsh welding environment, which exceeds that of conventional proximity sensors.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A proximity sensor, comprising:
    an elongated circular cylindrical sidewall portion formed of a material comprising copper and having spaced apart ends, the material having a thermal conductivity of at least about three Watts per centimeter per Kelvin; and
    proximity sensing circuitry located within the sidewall portion, the proximity sensor being operative to sense proximity of an object through one of the ends of the sidewall,
    wherein the sidewall portion is threaded about an axis extending longitudinally through the sensor housing, whereby when the proximity sensor is employed in a welding environment, slag build-up is mitigated.

2. The proximity sensor of claim 1, wherein the sidewall portion is formed of a copper alloy.

3. The proximity sensor of claim 1, wherein the sensing circuitry further comprises an inductive proximity sensing device.

4. A proximity sensor, comprising:
    sensing circuitry for sensing the proximity of an object; and
    an elongated circular cylindrical externally threaded housing formed of a material having a thermal conductivity of at least about three Watts per centimeter per Kelvin and having spaced apart ends for receiving the proximity sensing circuitry therein;
    whereby when the proximity sensor is employed in a welding environment, slag build up on the housing is mitigated.

5. The proximity sensor of claim 4, wherein the housing is copper.

6. The proximity sensor of claim 4, wherein the sensing circuitry further comprises an inductive proximity sensing device.

7. The proximity sensor of claim 6, wherein the sensing circuitry includes an inductor coil and associated circuitry mounted to a circuit board and located adjacent to a sensing end.

8. The proximity sensor of claim 4, wherein the housing is in the form of a cylindrical sleeve for receiving a body portion of the proximity sensor, the cylindrical sleeve being at least coextensive with an outer sidewall of the body portion.

9. The proximity sensor of claim 4, wherein the housing has a sensing end and a connector end, the connector end having a connector for receiving and connecting to a desired cable.

10. The proximity sensor of claim 9, the connector being a male connector.

11. The proximity sensor of claim 9, the connector being a female connector.

* * * * *